United States Patent
Smith et al.

(10) Patent No.: US 6,681,337 B1
(45) Date of Patent: Jan. 20, 2004

(54) METHOD AND APPARATUS FOR LOADING DATA FROM AN ADDRESS SPECIFIED BY AN ADDRESS REGISTER INTO A DIFFERENT REGISTER WHEREIN THE REGISTERS ARE CLOCKED IN DIFFERENT TIME DOMAINS

(75) Inventors: Brian L. Smith, Sunnyvale, CA (US); Jurgen M. Schulz, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/557,987

(22) Filed: Apr. 25, 2000

(51) Int. Cl.$^7$ ................................................ G06F 7/00
(52) U.S. Cl. ...................... 713/400; 711/167; 703/13; 365/233
(58) Field of Search ................ 703/15; 710/20, 710/57; 713/1, 400, 500, 502; 714/29; 365/233

(56) References Cited

U.S. PATENT DOCUMENTS

| | | | | |
|---|---|---|---|---|
| 4,025,900 A | * | 5/1977 | Miller | 463/60 |
| 4,642,791 A | * | 2/1987 | Mallozzi et al. | 710/71 |
| 5,179,679 A | * | 1/1993 | Shoemaker | 711/118 |
| 5,497,456 A | * | 3/1996 | Alexander et al. | 714/29 |
| 5,598,552 A | | 1/1997 | Fotouhi et al. | |
| 5,640,366 A | | 6/1997 | Majos et al. | |
| 5,734,869 A | * | 3/1998 | Chen | 703/15 |
| 5,760,836 A | * | 6/1998 | Greenfield et al. | 375/240.05 |
| 5,812,813 A | * | 9/1998 | Henry et al. | 712/218 |
| 5,812,875 A | * | 9/1998 | Eneboe | 710/20 |
| 5,900,753 A | | 5/1999 | Côté et al. | |
| 5,978,311 A | * | 11/1999 | Wilford et al. | 365/233 |
| 6,016,403 A | * | 1/2000 | Hawkins et al. | 710/57 |
| 6,185,664 B1 | * | 2/2001 | Jeddeloh | 711/167 |
| 6,496,544 B1 | * | 12/2002 | Bethard | 375/296 |

FOREIGN PATENT DOCUMENTS

| | | | |
|---|---|---|---|
| EP | 768 630 | 10/1997 | |
| EP | 798630 A1 | * 10/1997 | G06F/5/06 |

OTHER PUBLICATIONS

Heuring, Vincent et al, Computer Systems Design and Architecture, 1997, pp. 48–49 and 310–315.*
"Apparatus for Transferring Data," Giroux, et al., IBM Technical Disclosure Bulletin, vol. 5, No. 7, Dec. 1962, p. 869, XP002186487, New York.
International Search Report, PCT/US 01/13397, mailed Jan. 18, 2002.
"Introduction to JTAG Boundary Scan," Sun Microelectronics, White Paper, Jan. 1997, pp. 1–8.

* cited by examiner

Primary Examiner—Thomas Lee
Assistant Examiner—Mark Connolly
(74) Attorney, Agent, or Firm—Lawrence J. Merkel; Meyertons, Hood, Kivlin, Kowert & Goetzel, P.C.

(57) ABSTRACT

An integrated circuit includes an address register, clocked by the clock signal corresponding to the TAP, used to address a control/status register within the integrated circuit. The address register receives a signal indicating that an address is to be loaded into the address register. A control circuit is coupled to receive the signal and to generate a second signal responsive to the address register being loaded. A shadow register, clocked by the clock signal of the integrated circuit, is coupled to receive the second signal and to load a value from the control/status register addressed by the address loaded into the address register responsive to the second signal. In this manner, a valid value from the addressed register is synchronized in the clock domain of the addressed register. The value for the shadow register may subsequently be synchronized into the clock domain of the TAP, and subsequently transferred out of the integrated circuit via the test interface.

28 Claims, 4 Drawing Sheets

METHOD AND APPARATUS FOR LOADING DATA FROM AN ADDRESS SPECIFIED BY AN ADDRESS REGISTER INTO A DIFFERENT REGISTER WHEREIN THE REGISTERS ARE CLOCKED IN DIFFERENT TIME DOMAINS

BACKGROUND OF THE INVENTION

1. Field of the Invention

This invention is related to the field of electronic circuits and, more particularly, to capturing a register value to another clock domain within an integrated circuit.

2. Description of the Related Art

Integrated circuits typically include test circuitry used to allow testing of the integrated circuits at manufacturing time or even in a system with other integrated circuits. For example, the test access port (TAP) defined by the Joint Test Access Group (JTAG) and later refined into Institute of Electrical and Electronics Engineers (IEEE) standard 1149.1 is a popular test circuit. The JTAG TAP typically operates at a relatively low clock frequency (e.g. 10 MHz). However, the other circuitry within the integrated circuit may operate at a significantly higher frequency (e.g. 33 MHz to approximately 1 GHz is possible today, and higher frequencies than 1 GHz are expected in the future). Thus, the JTAG TAP is said to be in a first clock domain and the other circuitry in the integrated circuit is said to be in a second clock domain different than the first.

If the TAP is activated while the integrated circuit is in operation and the test requires capturing values from the integrated circuit into the TAP controller, then the test involves transferring a value from a register in the second clock domain to a register in the first clock domain. Since the clocks are of different frequencies (and/or may have phase differences with respect to each other or no phase relationship at all), the transfer must be synchronized in some fashion. This transfer may be particularly problematic if the value to be transferred is changing at the time the value is being transferred. For example, a register in the first clock domain may be configured to receive a multi-bit register value from the second clock domain one bit at a time. If the multi-bit register value is changing during the synchronization, some bits of the multi-bit value may reflect the value prior to the change, and other bits of the multi-bit value may reflect the value subsequent to the change. Thus, the resulting multi-bit value in the first clock domain may be inaccurate. Even if the multi-bit value is synchronized in parallel, some of the bits may synchronize on one clock of the first clock domain and other bits may synchronize on another clock. Thus, the synchronized value in the first clock domain may not reflect the state of the multi-bit value.

The above problem may be even further exacerbated for registers that are changing frequently (e.g. a counter that increments each period of the second clock domain or periodically each N periods). Values from these registers may be even more likely to be synchronized into the JTAG TAP clock domain as invalid values.

SUMMARY OF THE INVENTION

The problems outlined above are in large part solved by an integrated circuit as described herein. The integrated circuit includes an address register, clocked by the clock signal corresponding to the TAP and thus in a first clock domain, used to address a control/status register within the integrated circuit. The address register receives a signal indicating that an address is to be loaded into the address register. A control circuit is coupled to receive the signal and to generate a second signal responsive to the address register being loaded. The control register may generate the second signal after the address register has stabilized for observation in a second clock domain corresponding to the clock signal of the integrated circuit. A shadow register, clocked by the clock signal of the integrated circuit and thus in the second clock domain, is coupled to receive the second signal and to load a value from the control/status register addressed by the address loaded into the address register responsive to the second signal. In this manner, a valid value from the addressed register is synchronized in the second clock domain. The value for the shadow register may subsequently be synchronized into the first clock domain (of the TAP), and subsequently transferred out of the integrated circuit via the test interface.

A similar sequence may be performed for a write from the TAP to a control/status register. More particularly, the control circuit may receive the signal indicating that an address is loaded into the address register and may generate a second signal to select the addressed control/status register in response to the signal (after the address register is stabilized for observation in the second clock domain). Similarly, the control circuit may receive a third signal indicating that the data to be written is loaded into a data register (in the first clock domain) and may generate a fourth signal in response to the third signal (after the data register is stabilized for observation in the second clock domain). In response to the fourth signal, the data may be loaded into the selected control/status register.

BRIEF DESCRIPTION OF THE DRAWINGS

Other objects and advantages of the invention will become apparent upon reading the following detailed description and upon reference to the accompanying drawings in which.

Figure 1:
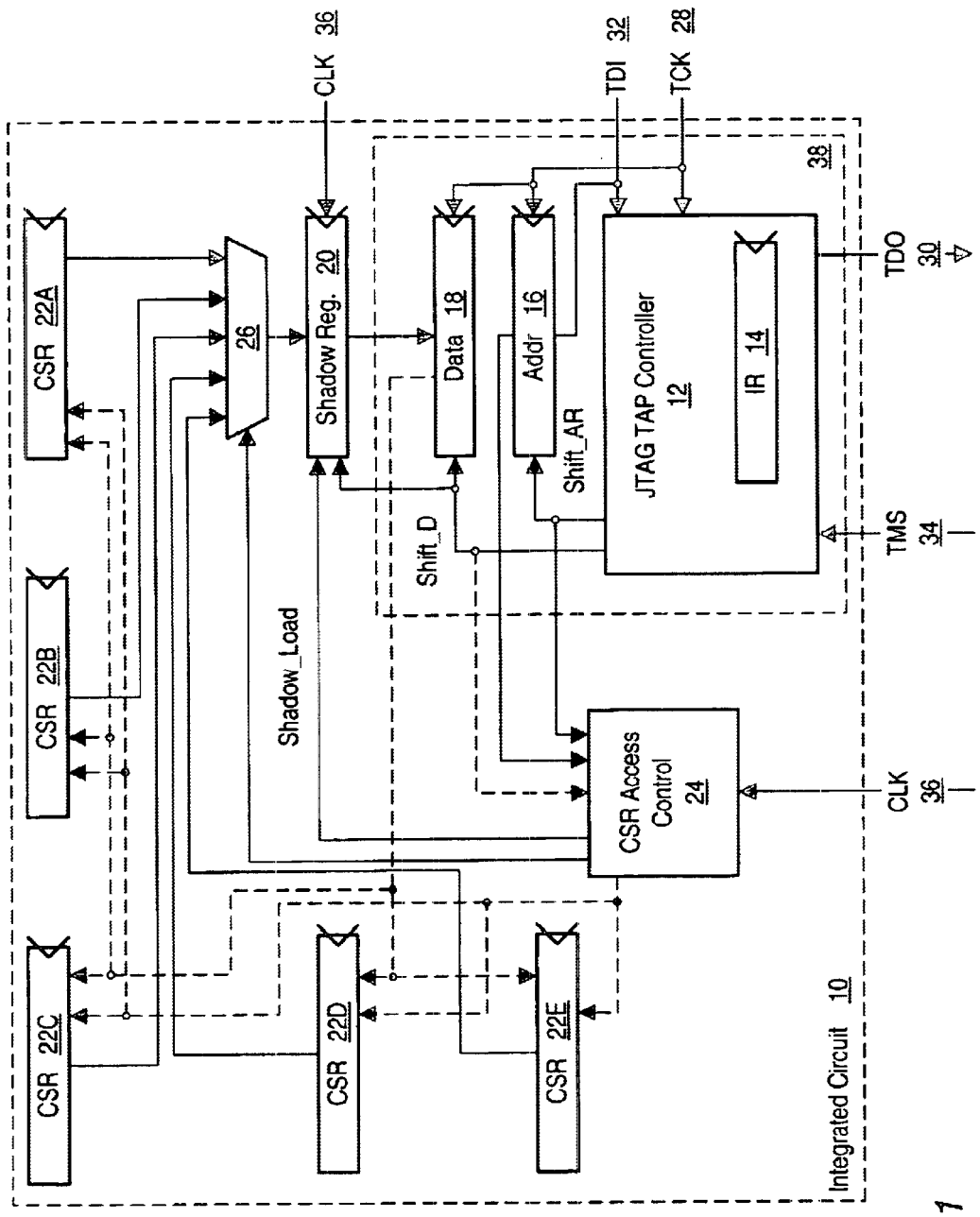
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of an integrated circuit 10 is shown. Other embodiments are possible and contemplated. In the embodiment shown, integrated circuit 10 includes a JTAG TAP controller 12 (which includes an instruction register (IR) 14 specified by the IEEE 1149.1 specification), an address register 16, a data register 18, a shadow register 20, a plurality of control/status registers (CSRs) 22A–22E, a CSR access control circuit 24, and a CSR mux 26. JTAG TAP controller 12 is coupled to a test interface and is further coupled to address register 16, data register 18, and CSR access control circuit 24. The test interface comprises various inputs and outputs to the test TAP controller 12 and circuitry. In the illustrated embodiment, the test interface is the JTAG test interface including a clock signal (TCK) on line 28, a test data out (TDO) signal on line 30, a test data in signal (TDI) on line 32, and a test mode select (TMS) signal on line 34. The interface may also include a reset signal (TRST) (not shown). Address register 16 is coupled to CSR access control circuit 24 and is clocked by the TCK clock signal, and may also be coupled to receive the TDI signal. Data register 18 is coupled to shadow register 18 and is clocked by the TCK signal as well. CSR access control circuit 24 is coupled to receive a clock signal CLK on line 36. Each of shadow register 20 and CSRs 22A–22E are clocked by the clock signal CLK (connections to CSRs 22A–22E not shown in FIG. 1). While the connection of shadow register 20 to line 36 is shown separate from the connection to CSR access control circuit 24 for clarity in the drawing, the clock signal CLK may generally be routed to shadow register 20 within integrated circuit 10. CSR access control circuit 24 is further coupled to CSR mux 26 and shadow register 20. Shadow register 20 is coupled to receive an output of CSR mux 26, which is further coupled to each of CSRs 22A–22E as inputs.

Since data register 18, address register 16, and JTAG TAP controller 12 are all clocked by the TCK clock signal, these elements form a clock domain illustrated by dotted box 38. The remainder of integrated circuit 10, being clocked by the CLK clock signal, forms another clock domain. The frequency of the CLK clock signal may generally be greater than the frequency of the TCK clock signal. For example, the TCK clock signal may generally operate at a frequency of approximately 10 MHz, while the CLK clock signal may operate at any other frequency. For example, the CLK clock signal may have a frequency in the range of 33 MHz to 1 GHz or more. For the illustrated embodiment, the frequency of the CLK clock signal may be greater than the frequency of the TCK clock signal.

Generally speaking, each of CSRs 22A–22E is scannable via the test interface. In other words, each of the CSRs 22A–22E may be selected, via signal combinations on the test interface, to provide its current value on the test interface. In this manner, observability to the internal state of integrated circuit 10 may be achieved. More particularly, each of the CSRs 22A–22E may be assigned an address that uniquely identifies that CSR among the CSRs 22A–22E. Signal combinations on the test interface may be used to provide an address in address register 16 which identifies one of the CSRs 22A–22E. An internal signal (Shift_AR in FIG. 1) may be asserted by TAP controller 12 to indicate that address register 16 is to load the address provided on the test interface. The same signal may be applied to CSR access control circuit 24, ultimately causing the value in the identified CSR to be loaded into shadow register 20 responsive to the signal. More particularly, the CSR access control circuit 24 may include a decoder that decodes the address and selects the CSR. Then the CSR may be loaded into shadow register 20 after the address register has stabilized for observation in the CLK clock domain. Subsequently, the value in shadow register 20 may be loaded into data register 18, thus transferring the value into the clock domain of the TCK clock signal. More particularly, the data may be transferred into the data register 18 after the data in the shadow register 20 has stabilized for observation in the TCK clock domain. Additional commands on the test interface may be used to scan the data out of data register 18 onto the test interface, and thus the value of the selected CSR may be observed on the test interface.

By capturing the addressed CSR into shadow register 20 responsive to that address being loaded into address register 16, each of the bits stored in the CSR is concurrently synchronized in the clock domain of the CSR (i.e. the CLK clock domain). Thus, a valid value is captured, and later transferred to the clock domain of the JTAG TAP (i.e. the TCK clock domain). Furthermore, since the bits stored in the CSR are concurrently loaded into shadow register 20 in the clock domain of the CSR, even CSRs which are frequently changing (e.g. a counter which changes every period or every N periods) may be validly observed via the test interface.

Each CSR 22A–22E may store a portion of the state of integrated circuit 10. Various circuitry within integrated circuit 10 (not shown) may use the values in the CSRs 22A–22E to determine the operation of the circuitry and/or to report status of the circuitry in operation.

In the embodiment shown, the address is shifted into the address register 16 from the test interface. JTAG TAP controller 12, upon determining that the test interface is providing an address, may assert the Shift_AR signal coupled to address register 16. The Shift_AR signal may remain asserted until each bit of the address has been shifted into address register, and may then be deasserted. While the Shift_AR signal is asserted, address register 16 shifts in input bits from the TDI signal. Address register 16 ceases shifting when the Shift_AR signal is deasserted. CSR access control circuit 24 receives the Shift_AR signal and may determine that the address register has been loaded by detecting the deassertion transition (from asserted to deasserted) of the Shift_AR signal. Since the CSR access control circuit 24 operates in the CLK clock domain and the JTAG TAP controller 12 operates in the TCK clock domain, CSR access control circuit 24 may synchronize the Shift_AR signal into the CLK clock domain. More particularly, CSR access control circuit 24 may "dual rank synchronize" the Shift_AR signal and may detect the deassertion of the Shift_AR signal by examining the dual rank synchronized signal. A signal is dual ranked synchronized into a clock domain if the signal has been passed through at least a pair of clocked storage devices (e.g. flops, registers, latches, etc.) clocked by the clock signal defining that clock domain. If the signal is stable after each transition for at least 2 clock periods of the clock signal, dual rank synchronization may be used to detect each transition.

While the deassertion transition of the Shift_AR signal may indicate that the address of the CSR is available in address register 16, CSR access control circuit 24 may delay N CLK clock periods from detecting the transition before it uses the address in order to allow the address to stabilize in the CLK clock domain. The number of clock periods of delay may be based, in part, on the ratio of the frequency of the CLK clock signal to the frequency of the TCK clock signal. For example, the delay may be a number of CLK clock periods greater than or equal to the ratio, allowing a clock period of the TCK clock to expire from the transition of the Shift_AR signal to the use of the address. Alternatively, the delay may be a number of CLK clock periods greater than or equal to twice the ratio, allowing for two clock periods of the TCK clock to expire.

CSR access control circuit 24 decodes the address from address register 16 and provides select controls to CSR mux 26 to select the addressed CSR 22A–22E. In this manner, the value stored in the addressed CSR 22A–22E may be provided as an input to shadow register 20. CSR access control circuit 24 may then assert the Shadow_Load signal to shadow register 20 to cause shadow register 20 to load the input.

Once the value stored in the addressed CSR 22A–22E has been loaded into shadow register 20, it is ready to be transferred to data register 18. The operation is triggered in response to inputs on the test interface. After such an input, JTAG TAP controller 12 may assert an internal signal to data register 18 to load the value stored in shadow register 20. In the illustrated embodiment, this signal is denominated as a Shift_D signal (which may operate similar to the Shift_AR signal described above). Since the value is shifted in, a wide bus between shadow register 20 and data register 18 may be avoided. Thus, shadow register 20 may be physically located within integrated circuit 10 at any convenient place (e.g. not physically near data register 18), since the interconnect between the two registers is limited. In an embodiment using shifting to load the shadow register value into data register 18, shadow register 20 may receive the TCK clock signal and may control shifting using the TCK clock signal. The parallel load from mux 26 may be controlled by the CLK clock signal. In an embodiment using parallel load from the shadow register 20 into data register 18, shadow register 20 may not receive the TCK clock signal.

Since the test interface operates at a lower frequency than the integrated circuit 10 and multiple cycles of transfer may be used to transmit commands on the test interface, shadow register 20 may load the input (the value from the addressed CSR 22A–22E) well before the value is shifted into the data register (e.g. at least several clock periods of the TCK clock signal). Thus, the value at the output of shadow register 20 may be stable prior to transferring the value to data register 18 and thus the data need not be explicitly synchronized. However, this synchronization could be implemented, if desired.

The above description refers to loading a register. A register is loaded if the value at the input of the register is stored into the register and retained by the register during the succeeding clock period. The register provides a value loaded into the register at its output subsequent to being loaded.

In the embodiment shown, the test interface is the JTAG test interface including the TMS, TDI, and TDO signals. The TDI signal is used to shift bits of data into integrated circuit 10, and the TDO signal is used to shift bits of data out of integrated circuit 10, at a maximum rate of one bit per TCK clock period. The TMS signal is used to select test modes, and cycles the JTAG TAP controller 12 through the TAP state machine defined by the IEEE 1449.1 specification. It is noted that various signal combinations may be used to cause the desired behavior in JTAG TAP controller 12. Generally, a signal combination may be one or more TCK periods of signal assertions and deassertions on the TMS and TDI signals as defined in the IEEE 1149.1 specification.

JTAG TAP controller 12 includes instruction register 14, into which instructions may be shifted using the TDI input signal. The IEEE 1449.1 specification defines three mandatory instructions (EXTEST, SAMPLE/PRELOAD, and BYPASS). JTAG TAP controller 12 may support one or more additional instructions, such as an address load instruction and a data load instruction described herein. In response to the address load instruction, JTAG TAP controller 12 may load the next M bits transmitted on the TDI signal into address register 16 (where M is the number of bits in address register 16, which may be at least enough bits to specify an address for each of the CSRs). More particularly, the JTAG TAP controller 12 may assert the Shift_AR signal to address register 16, which may then receive the TDI signal as a shift-in input. Thus, over the next M clock periods of the TCK clock signal, bits transmitted on the TDI signal are shifted into address register 16. In response to the data load instruction, JTAG TAP controller 12 may ensure sufficient delay has occurred to stabilize the shadow register data value in the TCK clock domain and may assert the Shift_D signal for a number of TCK clock periods equal to the number of bits in data register 18. In one embodiment, the delay to ensure stability of the shadow register data value may occur inherently due to the longer clock period of the TCK clock signal and the shifting of the instruction into the IR register 14. Accordingly, a sequence of signal combinations on the JTAG interface to read a value of a CSR may include signal combinations shifting the address load instruction into the instruction register, followed by the shifting of the address of the CSR to be read into address register 16, followed by shifting the data load instruction into the instruction register 14, followed by shifting the transfer to DR instruction into the instruction register, followed by shifting data from the DR register 13 onto the TDO signal.

While the JTAG interface is used as the test interface, any suitable test interface could be used in alternative embodiments. Additionally, the above method for addressing a register in a first clock domain from a second clock domain, using the signal indicating that the address register is loaded to load a shadow register with the value in the addressed register may be used for any two clock domains, even if circuitry in the two domains is not being used for testing purposes.

While FIG. 1 illustrates one shadow register 20, multiple shadow registers could be used. For example, a shadow register could be included for each CSR, if desired. Furthermore, an integrated circuit having two or more clock domains in addition to the TCK clock domain may employ the above method. For example, each of the clock domains other than the TCK clock domain could employ a CSR access control circuit and a shadow register as described above. Alternatively, a single CSR access control circuit may be used, designed for the worst case delay of the various clock domains.

As mentioned above, a similar sequence may be performed for a write from the TAP to a CSR 22A–22E. More particularly, the CSR access control circuit 24 may receive the Shift_AR signal and may generate a second signal to select the addressed CSR 22A–22E in response to the Shift_AR signal (after the address register is stabilized for observation in the second clock domain). Similarly, the CSR access control circuit may receive the Shift_DR signal and may generate a CSR load signal to the selected CSR 22A–22E in response to the deassertion transition of the Shift_DR signal (after the data register 18 is stabilized for observation in the CLK clock domain). In response to the CSR load signal, the data may be loaded into the selected control/status register. Dotted lines from the Shift_DR signal to CSR access control circuit 24, from CSR access control circuit 24 to each CSR 22A–22E (for the control signal for each CSR to load the data from data register 18), and from data register 18 to each CSR 22A–22E (to provide the data from data register 18 as an input) illustrate exemplary connections for performing writes to CSRs. Each CSR 22A–22E may receive a separate control signal from CSR access control circuit 24, and CSR access control circuit 24 may assert one of the signals responsive to decoding the address from the address register to cause the selected CSR 22A–22 to update with the data from data register 18.

While the address register 16 and the data register 18 are loaded via shifting in the above embodiment, other embodiments may load the registers in any suitable fashion. For example, each bit of the address register 16 and/or data register 18 may be parallel loaded and the signal to load could be a pulse.

Figure 2:
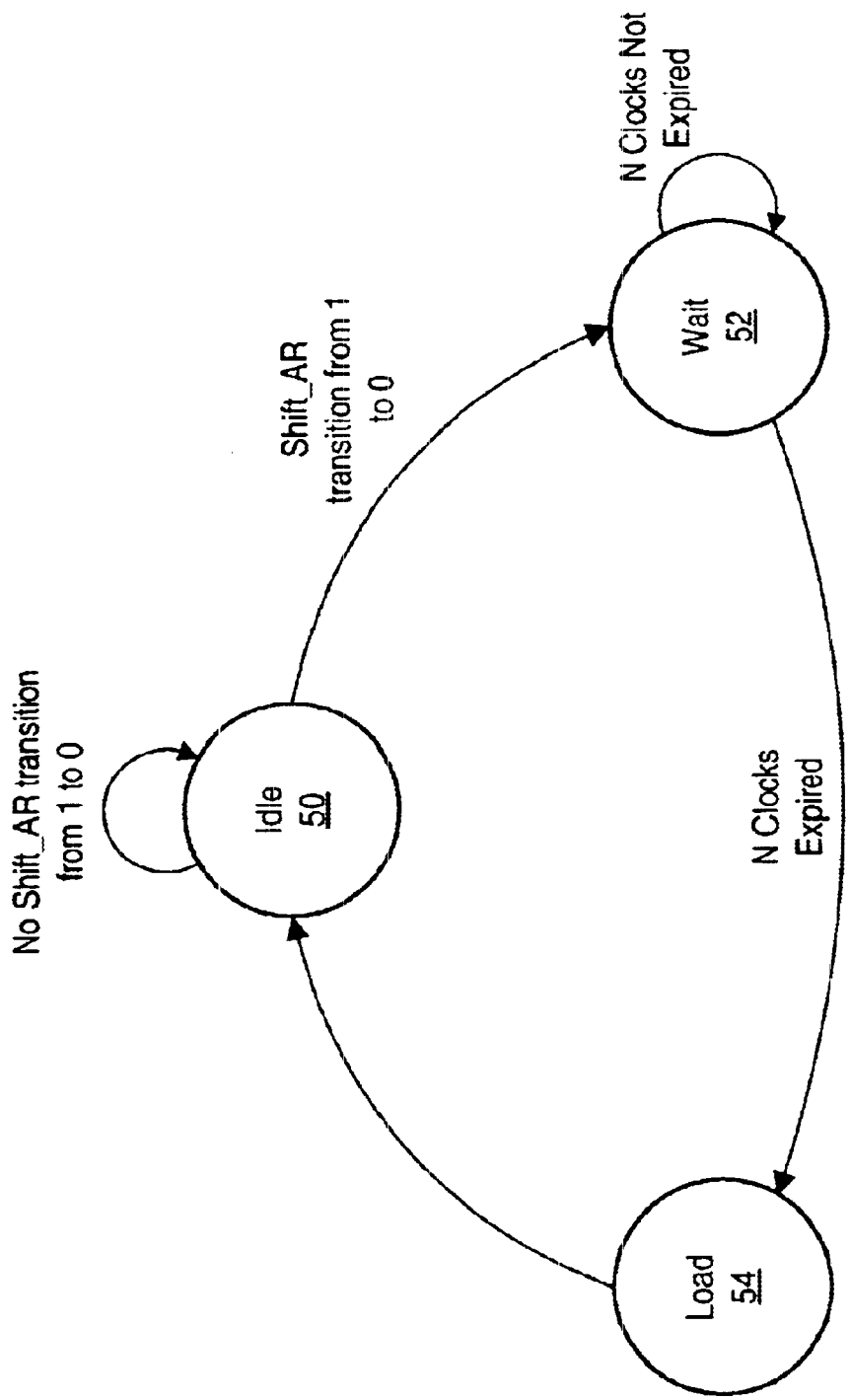
FIG. 2 is a state machine diagram illustrating one embodiment of a state machine which may be employed by a CSR access control circuit shown in FIG. 1.

Turning next to FIG. 2, a state machine diagram of an exemplary state machine that may be employed in one embodiment of CSR access control circuit 24 is shown. Other embodiments are possible and contemplated. In the embodiment of FIG. 2, the state machine includes an idle state 50, a wait state 52, and a load state 54.

In idle state 50, CSR access control circuit 24 is not preparing to load data corresponding to an addressed CSR into shadow register 20. The state machine remains in idle state 50 if no deassertion transition on the Shift_AR signal is detected. If a deassertion transition on the Shift_AR signal is detected, the state machine transitions to wait state 52.

In wait state 52, CSR access control circuit 24 waits for N clock periods to expire, in order to allow the address in address register 16 to stabilize (as described above). Thus, the state machine remains in wait state 52 if N clock periods have not expired and transitions to load state 54 if N clock periods have expired.

In load state 54, CSR access control circuit 24 decodes the address from address register 16 and asserts select control signals to CSR mux 26, and asserts the Shadow_Load signal. The state machine then returns to idle state 50.

A similar state machine may be employed, based on the Shift_DR signal, to update a CSR 22A–22E with data from data register 18. In such an embodiment, in the load state 54, CSR access control circuit 24 may decodes the address from address register 16 and asserts a CSR_Load signal to the selected CSR.

It is noted that, while the above description refers to decoding the address after waiting N clock periods of the CLK clock signal, other embodiments may combinatorially decode the address. Select control signals to CSR mux 26 may thus vary from clock period to clock period, but may settle to selection of the addressed register as the address is address register 16 stabilizes.

Figure 3:
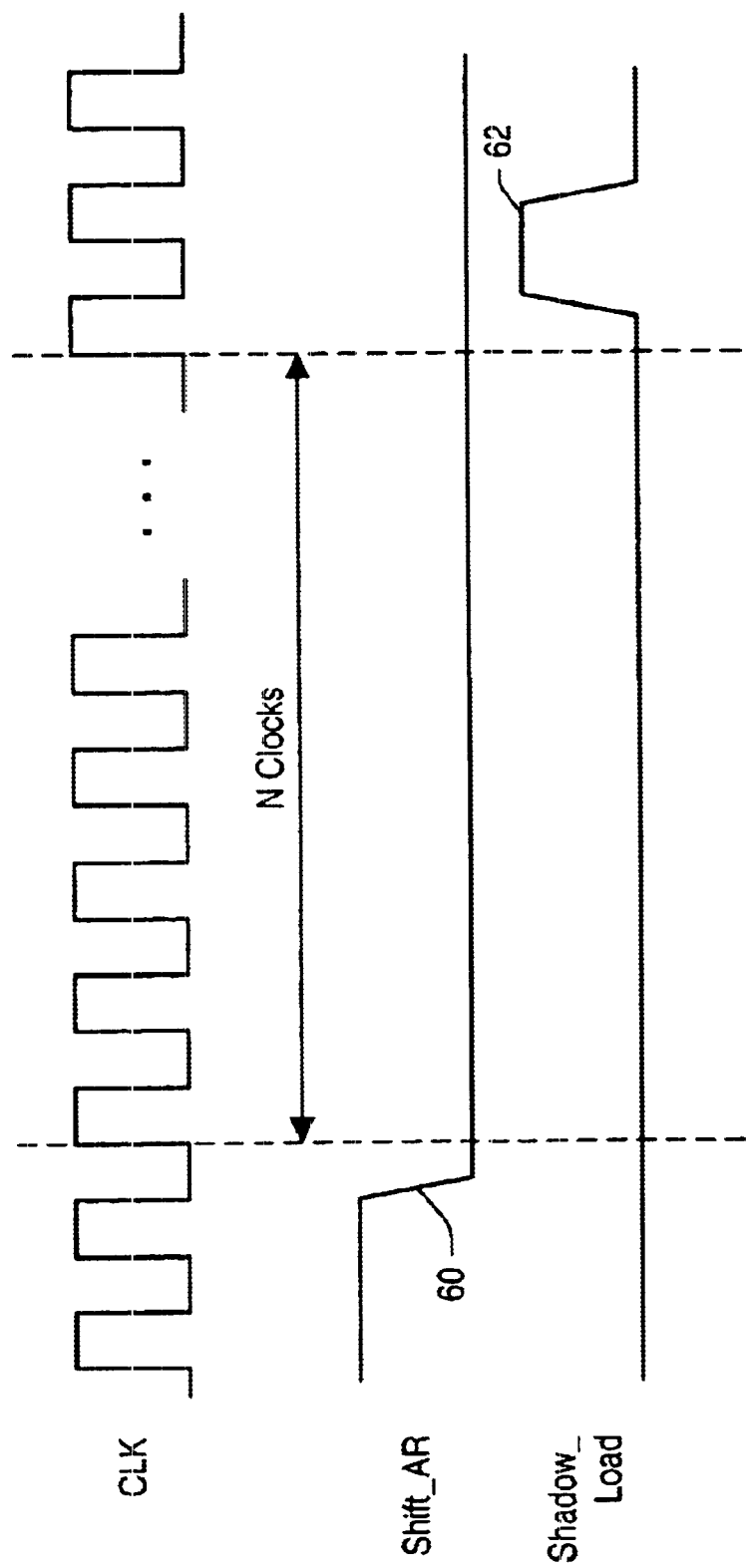
FIG. 3 is a timing diagram illustrating certain signals shown in FIG. 1 according to one embodiment of the integrated circuit.
Figure 4:
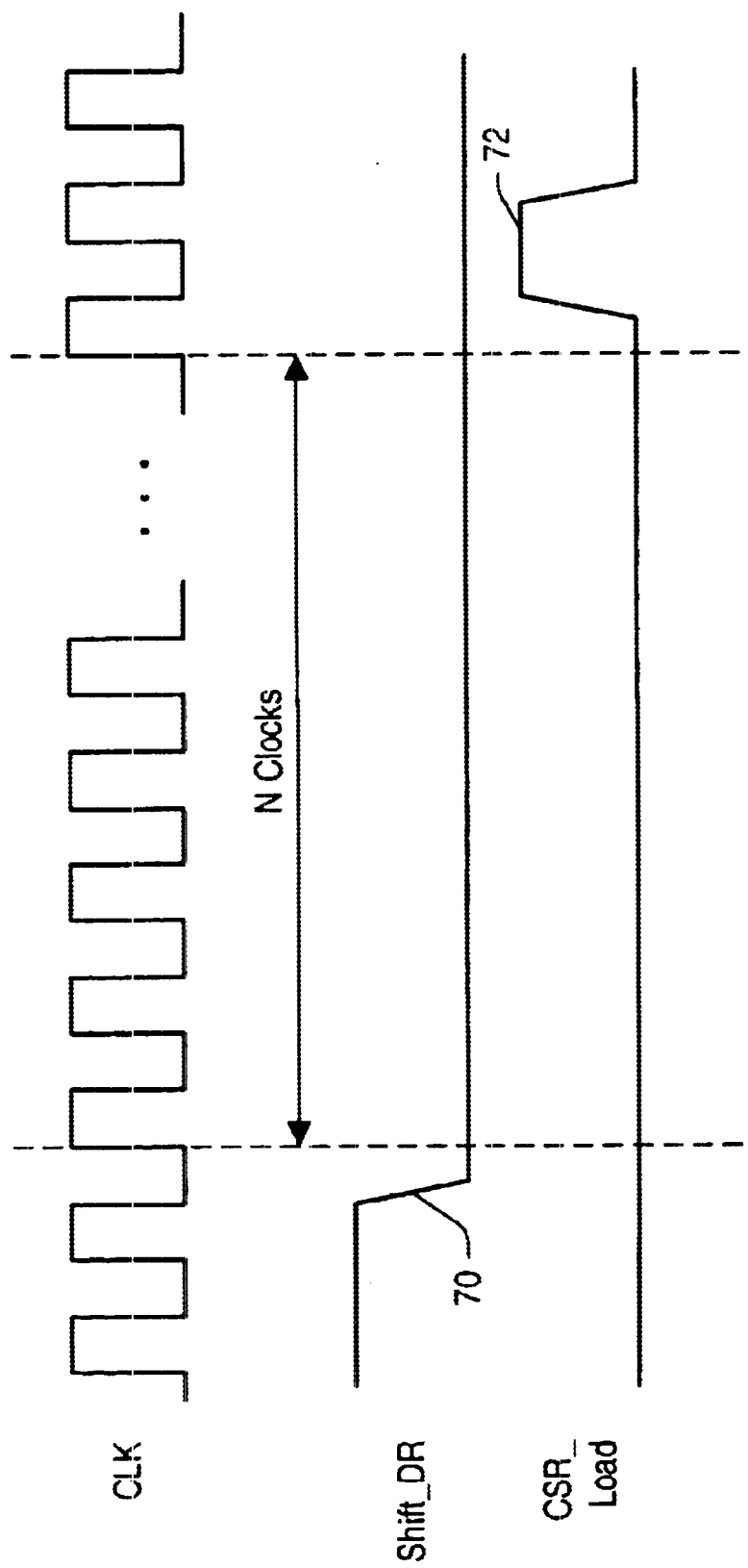
FIG. 4 is a timing diagram illustrating certain signals shown in FIG. 1 according to one embodiment of the integrated circuit.

Turning next to FIG. 3, a timing diagram is shown illustrating the CLK clock signal, the Shift_AR signal, and the Shadow_Load signal according to one embodiment of CSR access control circuit 24. Other embodiments are possible and contemplated. The Shift_AR signal transitions to a logic low (which may represent deassertion) (reference numeral 60). The Shift_AR signal shown in FIG. 3 may represent the dual rank synchronized output of the Shift_AR signal. Since the transition has been detected, CSR access control circuit 24 begins counting the N clock periods of delay prior to decoding the address and asserting the Shadow_Load signal. The N clock periods of delay may be represented in FIG. 3 as the distance between the two vertical dashed lines. After the delay expires, CSR access control circuit 24 pulse the Shadow_Load signal (reference numeral 62) to cause shadow register 24 to capture the value of the addressed CSR. A similar timing diagram with the Shift_DR signal 70 and N clock periods of delay to assert-ing the control signal (CSR_load) from CSR access control circuit 24 to the addressed CSR 22A–22E to update with the data from the data register is illustrated in FIG. 4. In the illustrated example, the CSR_load signal is pulsed after the N clock periods of delay (reference numeral 72).

It is noted that, in FIGS. 2 and 3, the deassertion transition of the Shift_AR signal is illustrated as a transition from a logical 1 to a logical 0, or from a high to a low. However, a signal may be defined to be asserted at a low value and deasserted at a high value, if desired.

Generally, the term "responsive" as used herein means that the event being responded to (e.g. a signal assertion or generation, etc.) is a condition precedent to the response. The response may be either indirectly or directly caused by the event being responded to.

Numerous variations and modifications will become apparent to those skilled in the art once the above disclosure is fully appreciated. It is intended that the following claims be interpreted to embrace all such variations and modifications.

What is claimed is:

1. An apparatus comprising:
   an address register configured to store an address indicative of a first register of a plurality of registers, wherein said address register is coupled to receive a first signal for loading said address into said address register, and wherein said address register is clocked by a first clock signal;
   a second register coupled to receive a value stored in said first register, said second register clocked by a second clock signal different from said first clock signal; and
   a control circuit coupled to receive said first signal, wherein said control circuit is configured to generate a second signal responsive to said first signal, and wherein said second register is coupled to receive said second signal and to load said value responsive to said second signal.

2. The apparatus as recited in claim 1 wherein said control circuit is configured to generate said second signal responsive to said first signal indicating that said address has been loaded into said address register.

3. The apparatus as recited in claim 2 wherein said control circuit is configured to: (i) delay one or more clock periods of said second clock signal from said first signal indicating that said address has been loaded into said address register, and then (ii) generate said second signal to cause said second register to load said value.

4. The apparatus as recited in claim 2 wherein said first signal is a shift signal, and wherein said shift signal indicates that said address register is loaded by transitioning from a shift state to a non-shift state.

5. The apparatus as recited in claim 4 wherein said control circuit is configured to dual rank synchronize said shift signal to generate said second signal.

6. The apparatus as recited in claim 1 further comprising a multiplexor coupled to each of said plurality of registers to receive values stored therein and further coupled to said control circuit to receive one or more select control signals, and wherein said control circuit is coupled to receive said address and to decode said address to generate said select control signals.

7. The apparatus as recited in claim 1 further comprising a second control circuit coupled to a test interface, wherein said second control circuit is configured to generate said first signal responsive to one or more commands received from said test interface.

8. The apparatus as recited in claim 7 wherein said test interface is compatible with the Joint Test Access Group (JTAG) test access port (TAP).

9. A method comprising:
loading an address register with an address indicative of a first register of a plurality of registers, wherein said address register is clocked by a first clock signal, and wherein said loading said address register is controlled by a first signal received by said address register;
generating a second signal responsive to said first signal; and
loading a value stored in said first register into a second register responsive to said loading said address register, wherein said second register is clocked by a second clock signal different from said first clock signal, wherein said loading said value is controlled by said second signal received by said second register.

10. The method as recited in claim 9 wherein said first signal is a shift signal, and wherein said loading said value is responsive to said shift signal transitioning from a shift state to a non-shift state.

11. The method as recited in claim 10 wherein said loading said value is delayed one or more clock periods of said second clock signal.

12. The method as recited in claim 9 wherein said loading said value comprises dual rank synchronizing said first signal into a clock domain of said second clock signal.

13. The method as recited in claim 9 wherein said loading said value comprises:
decoding said address; and
selecting said first register from said plurality of registers to input said value to said second register, said selecting responsive to said decoding.

14. The method as recited in claim 9 further comprising generating said first signal responsive to one or more commands received on a test interface.

15. An apparatus comprising:
an address register configured to store an address indicative of a first register of a plurality of registers, wherein said address register is coupled to receive a first signal for loading said address into said address register, and wherein said address register is clocked by a first clock signal, and wherein said first register is clocked by a second clock signal different from said first clock signal; and
a control circuit coupled to receive said first signal, wherein said control circuit is configured to use said address, responsive to said first signal, to select said first register.

16. The apparatus as recited in claim 15 wherein said control circuit is configured to use said address after delaying N clock periods of said second clock signal from receiving said first signal, wherein N is a positive integer.

17. The apparatus as recited in claim 16 further comprising a data register clocked by said first clock signal, wherein said data register is coupled to receive a second signal for loading data into said data register, and wherein said control circuit is coupled to receive said second signal and to cause said first register to update with said data responsive to said second signal.

18. The apparatus as recited in claim 17 wherein said control circuit is configured to cause said first register to update after delaying N clock periods of said second clock signal from receiving said second signal, wherein N is a positive integer.

19. The apparatus as recited in claim 15 further comprising a data register configured to receive a contents of said first register in response to said control circuit selecting said first register.

20. The apparatus as recited in claim 19, wherein said data register is clocked by said first clock signal.

21. The apparatus as recited in claim 19 wherein said data register is coupled to receive a second signal for loading data into said data register, and wherein said control circuit is coupled to receive said second signal and configured to cause said first register to update with said loaded data responsive to said second signal.

22. An apparatus comprising:
a test circuit coupled to a test interface, wherein said test interface includes a test clock pin and a test data input pin, the test circuit comprising:
a first means for receiving an address scanned into said test circuit on said test data input pin, said first means clocked by a test clock signal on said test clock pin, said address indicative of a first register of a plurality of registers, said first register clocked by a second clock signal different from said test clock signal; and
a second means for indicating that said address has been scanned into said first means; and
a third means for selecting said first register responsive to said address and said second means.

23. The apparatus as recited in claim 22 wherein said third means is configured to delay N clock periods of said second clock signal and then to select said first register, wherein N is a positive integer.

24. The apparatus as recited in claim 22 wherein said test circuit further comprises a fourth means for causing said first means to receive said address, said fourth means responsive to an instruction scanned into said fourth means on said test data input pin.

25. The apparatus as recited in claim 22 further comprising a fourth means for storing data, said fourth means receiving data from said first register responsive to said third means selecting said first register.

26. The apparatus as recited in claim 22 further comprising a fourth means for storing data, said data scanned into said fourth means on said test input pin.

27. The apparatus as recited in claim 26 further comprising said first register coupled to receive said data from said fourth means and still further comprising a fifth means for indicating that said data has been scanned into said fourth means, said third means configured to cause said first register to update within said data responsive to said fifth means.

28. The apparatus as recited in claim 27 wherein said third means is configured to delay N clock periods of said second clock signal and then to cause said first register to update, wherein N is a positive integer.

* * * * *